United States Patent
Agarwal et al.

(10) Patent No.: US 11,848,678 B2
(45) Date of Patent: *Dec. 19, 2023

(54) COMPARATOR LOW POWER RESPONSE

(71) Applicant: TEXAS INSTRUMENTS INCORPORATED, Dallas, TX (US)

(72) Inventors: Nitin Agarwal, Bangalore (IN); Venkat Ramakrishna Saripalli, Bangalore (IN); Venkata Ramanan R, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/931,557

(22) Filed: Sep. 13, 2022

(65) Prior Publication Data

US 2023/0006663 A1   Jan. 5, 2023

Related U.S. Application Data

(63) Continuation of application No. 17/223,097, filed on Apr. 6, 2021, now Pat. No. 11,444,612, which is a continuation of application No. 16/378,526, filed on Apr. 8, 2019, now Pat. No. 10,972,086.

(51) Int. Cl.
*H03K 5/24* (2006.01)
*H03F 1/02* (2006.01)
*H03F 3/45* (2006.01)

(52) U.S. Cl.
CPC ......... *H03K 5/2481* (2013.01); *H03F 1/0205* (2013.01); *H03F 3/45179* (2013.01)

(58) Field of Classification Search
CPC ............. G01R 19/0038; H03K 5/2418; H03K 5/2445; H03K 5/2481
USPC .......................................................... 327/65
See application file for complete search history.

(56) References Cited

U.S. PATENT DOCUMENTS

| | | | |
|---|---|---|---|
| 4,962,323 A | 10/1990 | Ta | |
| 5,621,340 A | 4/1997 | Lee et al. | |
| 7,106,132 B1 * | 9/2006 | Kewariwal | H03F 3/45188 330/144 |
| 7,375,559 B1 | 5/2008 | Cho et al. | |
| 7,479,915 B1 | 1/2009 | Singh et al. | |
| 7,511,537 B2 | 3/2009 | Kimura | |
| 8,138,742 B2 | 3/2012 | Hwu et al. | |

(Continued)

OTHER PUBLICATIONS

International Search Report for PCT/US2020/027131 dated Jul. 9, 2020, pp. 1-2.

(Continued)

*Primary Examiner* — Quan Tra
(74) *Attorney, Agent, or Firm* — Brian D. Graham; Frank D. Cimino

(57) ABSTRACT

In described examples, an amplifier can be arranged to generate a first stage output signal in response to an input signal. The input signal can be coupled to control a first current coupled from a first current source through a common node to generate the first stage output signal. A replica circuit can be arranged to generate a replica load signal in response to the input signal and in response to current received from the common node. A current switch can be arranged to selectively couple a second current from a second current source to the common node in response to the replica load signal.

20 Claims, 8 Drawing Sheets

(56) References Cited

U.S. PATENT DOCUMENTS

| | | | |
|---|---|---|---|
| 8,350,622 B2 | 1/2013 | Kumar et al. | |
| 2003/0184927 A1* | 10/2003 | Akita | G01R 19/16542 |
| | | | 361/5 |
| 2008/0055004 A1 | 3/2008 | Rysinski et al. | |
| 2012/0146599 A1 | 6/2012 | Oyama | |
| 2012/0212259 A1 | 8/2012 | Riva et al. | |
| 2015/0187335 A1 | 7/2015 | Sugiyama et al. | |
| 2018/0284832 A1 | 10/2018 | Agarwal et al. | |
| 2020/0358414 A1* | 11/2020 | Li | H03F 3/45645 |

OTHER PUBLICATIONS

Written Opinion dated Jul. 9, 2020, PCT Application No. PCT/US2020/027131, 5 pages.

* cited by examiner

US 11,848,678 B2

COMPARATOR LOW POWER RESPONSE

CROSS-REFERENCE TO RELATED APPLICATIONS

This application is a continuation of U.S. patent application Ser. No. 17/223,097, filed Apr. 6, 2021, which is a continuation of U.S. patent application Ser. No. 16/378,526, filed Apr. 8, 2019, now U.S. Pat. No. 10,972,086, each of which is incorporated by reference herein in its entirety.

BACKGROUND

Electronic circuits are designed to include increasingly smaller design features. The smaller design features of the electronic circuits can be used to attain smaller form factors, increased functionality, and reduced power consumption of the electronic circuits. Such electronic circuits can include amplifiers (including comparators) for controlling various systems. Some comparators are arranged as parts of control circuits. The stability and accuracy of such control circuits often depend on the latency of the included comparators. However, lowering the power consumption of the circuitry that includes the comparators can increase the delay and/or decrease the accuracy of an output signal generated by an included comparator.

SUMMARY

In described examples, an amplifier can be arranged to generate a first stage output signal in response to an input signal. The input signal can be coupled to control a first current coupled from a first current source through a common node to generate the first stage output signal. A replica circuit can be arranged to generate a replica load signal in response to the input signal and in response to current received from the common node. A current switch can be arranged to selectively couple a second current from a second current source to the common node in response to the replica load signal.

DETAILED DESCRIPTION

Figure 1:
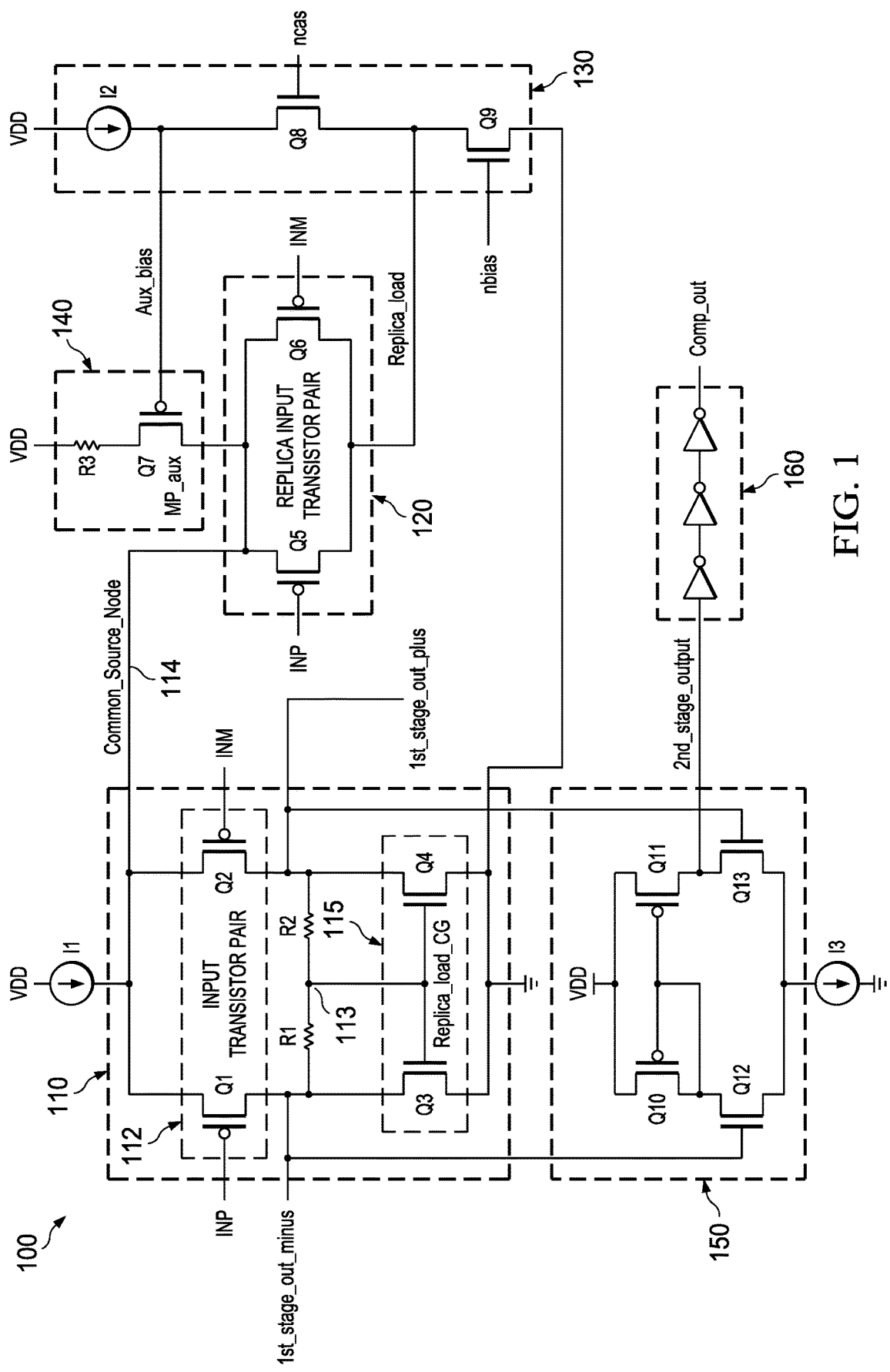
FIG. 1 is a schematic diagram of an example comparator for low-power response to input signal fluctuations.

Electronic circuits can include control circuits. For example, a control circuit can generate a control signal in response to a feedback signal. The feedback signal can be generated by measuring (e.g., comparing) a signal generated in response to a quantity developed at least in part in response to the control signal.

In some electronic circuits, a feedback signal can be generated by amplifying a signal (e.g., amplifying a voltage difference between respective conductors of a differential signal) generated in response to a quantity that is generated in response to the control signal. The stability and accuracy of such control circuits depend on the latency (e.g., delay) of the circuitry for generating the feedback signal. Generally, lowering the power consumption of the circuitry for generating the feedback signal can increase delay times and/or decrease the accuracy of the feedback signal.

In contrast, increasing the power consumption of the circuitry for generating the feedback signal can decrease delay times and/or increase the accuracy of the feedback signal. However, increasing the power consumption of the circuitry for generating the feedback signal can result in decreased operating characteristics, for example increased power consumption and increased heat dissipation (e.g., which could require remedial cooling), larger components (e.g., for greater power ratings), decreased battery life (e.g., which could otherwise require greater energy storage), and/or increase the need for line power for active cooling.

Some electronic systems can include amplifiers (e.g., which can include at least one transistor) that can be arranged for actively controlling a source current in response to input signal voltages. Some examples of the amplifiers can be arranged as comparators. For a given source current (e.g., for powering a comparator), comparators generally respond quickly to smaller voltage changes of the first and second input signals. Also, due to the time during which a common node settles to an appropriate (e.g., ideal) value, comparators generally respond more slowly to larger voltage changes that can be present in the first and second input signals. Increasing the source current output of a current source for powering the comparator can increase the speed and/or accuracy of the comparator. However, increasing the source current of the comparator also raises the power consumption of the comparator. Raising the power consumption of the comparator can render a comparator design as being unsuited for at least some lower power systems.

An example comparator described herein can be arranged for comparing a first input signal voltage against a second input signal voltage, and for generating an output signal (e.g., a single-ended or a complementary output signal) in response to the comparison. The example comparator can selectively increase power during some input conditions that could otherwise degrade performance (e.g., increase latency and/or decrease output accuracy).

FIG. 1 is a schematic diagram of an example comparator 100 for low-power response to input signal fluctuations. The comparator 100 includes a first stage 110, replica input transistor pair 120, an Aux_bias generator 130, current switch 140, a second stage 150, and a third stage 160. In at least one implementation, the comparator 100 is arranged to compare a pair of differential input signals and to selectively add current to a common node of a differential amplifier when a current-starved condition of the common node is detected.

The first stage 110 is an amplifier having an input transistor pair 112 and a current mirror 115. The input transistor pair can comprise PMOS (P-type metal-oxide-semiconductor) transistors such as transistors Q1 and Q2, where the transistors Q1 and Q2 include a common node (e.g., common source node 114) coupled to at least a first current source I1. In other examples, transistors Q1 and Q2 are different types of transistors. The current mirror includes NMOS (N-type metal-oxide-semiconductor) transistors Q3 and Q4, and resistors R1 and R2 (e.g., for generating the Replica_load_CG signal for biasing the common gates of Q3 and Q4). The drains of Q3 and Q4 are respectively coupled to the drains of Q1 and Q2. The resistors R1 and R2 (e.g., arranged as a voltage divider) are coupled in series between the respective drains of Q3 and Q4 (e.g., where the drains are coupled as first and second inputs of a current mirror that includes Q3 and Q4). In other examples, transistors Q3 and Q4 are different types of transistors. A central node 113 (e.g., divided voltage node) between the resistors R1 and R2 is coupled to bias respective control terminals (e.g., to commonly bias the gates) of Q3 and Q4.

The first stage 110 is a differential amplifier coupled to differentially receive input signals, such as a positive input signal (INP) and a negative input signal (INM). The signal INP and the signal INM respectively control currents flowing through Q1 and Q2. As described hereinbelow, the voltage of the common source node 114 is developed in response to the current sourced by a first current source (e.g., current source I1), and in response the currents selectively controlled by transistors Q1 and Q2. In some conditions (e.g., resulting from voltage changes of the input signals), a current-starved condition of the common source node 114 can develop, so that the voltage rise of the common node can be delayed and/or result in erroneous output of the comparator 100.

The replica input transistor pair 120 is a replica circuit of the input transistor pair 112. For example, the replica input transistor pair 120 includes PMOS transistors Q5 and Q6, which can be the same size or otherwise scaled to determine (e.g., detect, imitate, emulate, and/or simulate) a performance (e.g., at least one operational characteristic of Q1 and/or Q2) of the input transistor pair 112. The source nodes of Q5 and Q6 are coupled to the common source node 114, and the gates of Q4 and Q6 are respectively coupled to signals INP and INM. In such an arrangement, the replica input transistor pair 120 can respond to the same (or similar) contemporaneous input conditions to which the input transistor pair 112 is subjected. For example, the replica input transistor pair can detect a voltage drop of the common node, where the detected voltage drop is generated in response to a rise of an input signal (e.g., signal INP or INM).

The output of the replica input transistor pair 120 (e.g., the commonly coupled drains of Q5 and Q6) is a replica signal (e.g., Replica_load) for indicating (e.g., emulating) a contemporaneous response of the input transistor pair 112. As described hereinbelow, the replica signal can be coupled along a feedback path to generate a feedback signal (e.g., Aux_bias) for controlling the herein-described selective addition of current to the common source node 114 via the current switch 140. During a current-starved condition, for example, the output current (e.g., tail current) of the replica input transistor pair 120 is decreased, which indicates the current-starved condition. In response to the decrease of the tail current of the replica input transistor pair 120, the Aux_bias feedback signal is asserted, so that current flowing through the drain of Q7 contributes supplemental charge to the common source node 114.

The Aux_bias generator 130 is coupled to receive the output of the replica input transistor pair 120. The Aux_bias generator 130 includes a current source 12, an NMOS transistor Q8, and an NMOS transistor Q9. The transistor Q8 is biased by a normalized cascode (ncas) control signal and Q9 is biased by a normalized bias (nbias) control signal. The respective control signal voltages are selected, so that the Aux_bias generator 130 asserts the Aux_bias signal in response to a decrease in the current of the Replica_load signal (and de-asserts the Aux_bias signal when the Replica_load signal indicates the current-starved condition of the common source node 114 has been reduced).

When the signal Replica_load indicates a current-starved condition of the common source node 114, less current is added to the current flowing through the drain of Q9 (where the current otherwise flowing through Q9 is coupled from 12 via Q8). In response to less current being added to the current flowing through Q9, the voltage (e.g., of node Aux_bias) of the source of Q8 falls, so that PMOS transistor Q7 is turned on.

The current switch 140 includes Q7 and the resistor R3. Resistor R3 is a current source for coupling a limited current to be selectively coupled through Q7 into the common source node 114. The node Aux_bias is coupled to the control terminal (e.g., gate) of Q7. The transistor Q7 is arranged to selectively apply current to the common source node 114 in response to the Aux_bias voltage. In at least one example, the current source I1 is first current source, the current source R3 (e.g., which is coupled to VDD power rail) is a second current source, and the first and second current sources are coupled in parallel between a power rail and the common node.

The second stage 150 is a second stage amplifier that includes PMOS transistors Q10 and Q11 and NMOS transistors Q12 and Q13. The second stage amplifier is coupled to convert a differential input received from the first stage amplifier to single-ended output of the second stage amplifier. The transistor Q10 is a master transistor and the transistor Q11 is a slave transistor. The master and slave transistors are arranged as a current mirror for generating a second stage output signal in response to a first stage output signal (e.g., first stage output signals that are differential). For example, the current mirror (Q10 and Q11) transistors are biased in response to the first stage output-minus signal (1st_stage_out_minus signal), while the second stage output signal (2nd_stage_output signal) is developed in response to the 1st_stage_out_plus signal and in response to the current supplied by Q11. The second stage 150 can be arranged as a differential input to single-ended output converter. In another example (not shown), the second stage 150 can be arranged having a differential output, so that the comparator 100 can be arranged having a differential output.

The third stage 160 is an amplifier (e.g., buffer and/or output stage) arranged to quantize the second stage output (e.g., an analog signal, 2nd_stage_output), and to output a signal (e.g., digital signal) for indicating the result of the comparison of the pair of differential input signals. For example, the third stage can include an odd number of inverters for buffering and inverting the second stage output to generate the output signal as a comparator output (Comp_Out).

In examples described herein, a low-power response comparator includes an input transistor pair (e.g., input transistor pair 112) arranged for receiving first and second input signals (e.g., voltages that can vary over time). The input transistor pair can include a first transistor (e.g., Q1) and a second transistor (e.g., Q2). A first current terminal (e.g., source or drain) of the first transistor is coupled to a first current terminal of the second transistor and to a common node (e.g., common source node 114). A control terminal (e.g., gate) of the first transistor is coupled to the first input signal, and a control terminal of the second transistor is coupled to the second input signal.

A first current source (e.g., always-on current source I1) includes a current output coupled to the common node, so that (for example) the first current source provides a first current coupled through the common node to the respective current terminals of the first and second transistors. (The term "source" need not refer to a source terminal of a PMOS or a NMOS transistor and can refer to a source of a positive or negative current depending on context.)

A transistor of the input transistor pair can individually control a respective current in response to an input signal coupled to a control terminal of the transistor of the input transistor pair. In an example, each transistor of the input transistor pair can be arranged to independently control (e.g., by varying a current carried between source and drain terminals in response to a control signal) a portion of the source current that is sourced from the common node of the input transistor pair.

In an example, the respective sources of the input transistor pair are coupled to the common node, and the respective drains of the input transistor pair are coupled to respective drain nodes. Accordingly, a voltage change of a respective first and second input voltages can control the respective magnitude of the first and second currents, where the first and second currents respectively flow from a source to a drain (or, for example, from a drain to a source) of a respective transistor of the input transistor pair.

An example low-power response comparator (e.g., comparator 100) described herein can include a replica circuit (e.g., replica input transistor pair 120 circuit) for indicating (e.g., replicating or emulating) a response of the input transistor pair to changes in the first and second input signals. The replica circuit can include a replica input transistor pair that is coupled to receive a current from the common node that sources a current to the input transistor pair. The replica input transistor pair need not be instantiated (e.g., physically manufactured) using the same exact design features of each transistor of the input transistor pair; for example, the transistors of the replica input pair can be scaled, so that the replica circuit can emulate a scaled response of the input transistor pair.

An example replica input transistor pair can include a third and a fourth transistor. A first current terminal of the third transistor is coupled to a first current terminal of the fourth transistor and to the common node. A second current terminal of the third transistor is coupled to a second current terminal of the fourth transistor and to a feedback signal node. A control terminal of the third transistor is coupled to the first input signal, and a control terminal of the fourth transistor is coupled to the second input signal.

As described herein, the replica input transistor pair can emulate the input transistor pair. For example, the replica input transistor pair can generate a replica signal (e.g., at a Replica_load node of FIG. 1) for indicating (e.g., emulating) a contemporaneous response of the input transistor pair. The replica signal can be arranged to generate a feedback signal (e.g., Aux_bias signal of FIG. 1) for indicating a current-starved condition of the common node that is generated by the input transistor pair (e.g., generated at the common source node 114).

The replica input transistor pair can detect (e.g., by emulation of the input transistor pair) the current-starved response of the input transistor pair because, for example, the replica input transistor pair is coupled to like inputs (or buffered inputs derived from the like inputs) that are coupled to control the first transistor pair (e.g., input transistor pair).

The current-starved response is a response of the input transistor pair (e.g., input transistor pair 112) to the current sourced by the first current source and to the first and second input signals. For example, a current-starved condition can exist (e.g. result or develop) in a node between two transistors where the first transistor supplies a current to the node, and the capacitance of the node (and current conducted away from the node by the second transistor) impedes a voltage change of the node.

To determine the current-starved response, the second current terminals of the third and fourth transistors are coupled to a feedback signal node to generate a combined current. The combined current is an indication (e.g., the Replica_load signal) of the determined performance and is coupled to the feedback signal node for generating a feedback signal (e.g., the Aux_bias signal) for controlling a current switch (e.g., current switch 140).

The current switch includes a first current terminal coupled to a power rail, a second current terminal coupled to the common source node, and a control terminal coupled to the feedback signal node. The current switch is arranged to selectively couple current into the common node in response to the indication of the determined performance. A bias generator (e.g., Aux_bias generator 130) can generate a feedback signal (e.g., bias signal) in response to the indication of the determined performance. The feedback signal controls (e.g., activates and/or regulates) the current switch (e.g., a boost current source such as current switch 140). For example, the bias generator is arranged to assert the bias signal to activate the current switch in response to a decrease in current of the indication received from the feedback signal node.

Accordingly, a feedback loop exists, so that (for example) the current switch regulates (e.g., selectively provides in response to the feedback signal node) the coupling of a second current (e.g., augmentation current) to the common node. The feedback signals can include signals developed in the associated feedback path, such as the control signal for selectively controlling the current switch.

The current switch can be coupled to generate (e.g., amplify and/or inject) a controlled boost current for dynamically augmenting the source current for powering the input transistor pair. The source current for powering the input transistor pair can be selectively applied by controlling the addition of a boost current (e.g., as regulated by the current switch) to the common source node of the input transistor pair. Selectively augmenting the source current for powering the input transistor pair can save power that would otherwise be expended by providing, for example, a fixed magnitude source current (e.g., of the first current source) to avoid a current-starved response of the common source node of the input transistor pair.

The augmented source current is coupled to the first and second current terminals of the input transistor pair. In an example configuration, a second current terminal (e.g., drain or source) of the first transistor can be coupled to a first input of a second stage of the comparator and a second current terminal of the second transistor can be coupled to a second input of a second stage of the comparator. In the example configuration, the output signal (e.g., analog output signal) of the second stage can be quantized (e.g., converted to a digital value) and coupled as an output signal (e.g., as digital output) of the comparator. As described herein, the selective augmentation of the common node-sourced current can help reduce latencies and output errors while maintaining low power consumption of the low-power response comparator described herein.

The selective augmentation of the common node-sourced current for powering the input transistor pair can reduce static currents otherwise consumed by the input transistor pair and reduce latency (e.g., as described herein with respect to FIG. 1, FIG. 3, FIG. 5, and FIG. 7). Moreover, the selective augmentation of the source current can increase amplifier accuracy and eliminate some kinds of spurious comparator errors (e.g., as described herein with respect to FIG. 6).

A current-starved response of the common source node of the comparator 100 can be shown by disabling the turning on of the current switch 140 in simulations. For example, when the current switch 140 is disabled in simulations, latencies resulting from a current-starved common source node are shown (e.g., as described herein with respect to FIG. 2, FIG. 4, and FIG. 6), and an output error resulting from a current-starved common source node is shown (e.g., as described herein with respect to FIG. 6). The simulations were performed using a simulation program such as SPICE (simulation program with integrated circuit emphasis) to mathematically generate responses of a modeled circuit to input signal fluctuations.

Figure 2:
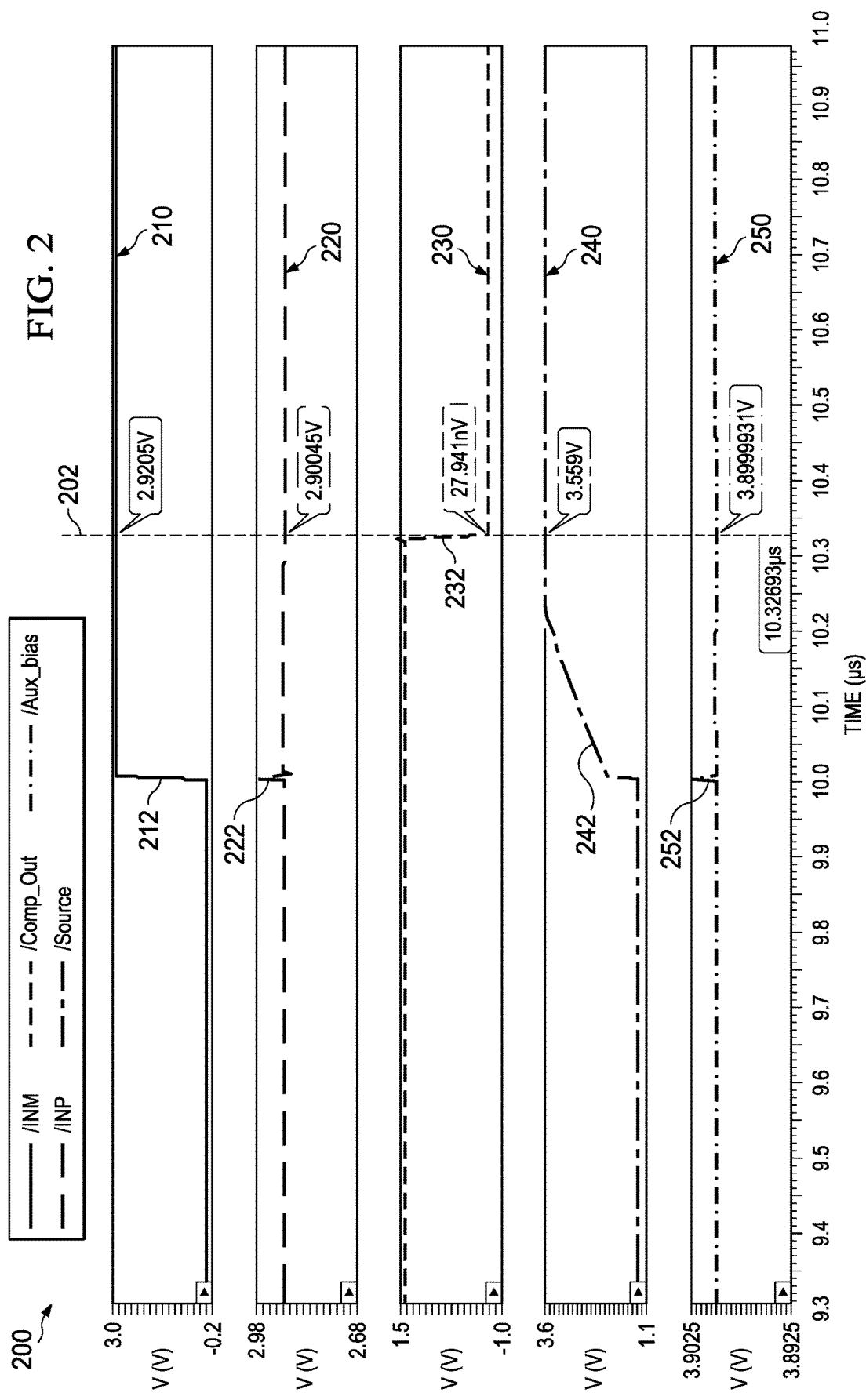
FIG. 2 is a waveform diagram of an example simulation of a disabled low-power response of the example comparator to a large input signal transition.

FIG. 2 is a waveform diagram of an example simulation of a disabled low-power response of the example comparator to a large input signal transition. The example simulation 200 includes waveforms for showing an example operation of portions of the comparator 100, described hereinabove with reference to FIG. 1. The example waveforms include the waveform INM 210 (e.g., the "input minus" signal coupled to the gate of Q2 of FIG. 1), the waveform INP 220 (e.g., the "input plus" signal of Q1), the waveform Comp_Out 230 (e.g., the "comparator output" signal of the third stage 160), the waveform Source 240 (e.g., of the node Common_Source_Node coupled to the respective sources of transistors Q1, Q2, Q5, and Q6 and coupled to the drain of Q7), and the waveform Aux_bias 250 (e.g., coupled to the gate of Q7). The low-power enhanced response of the example comparator to a large input signal transition can be disabled in response to a simulation parameter (e.g., a feedback signal to generate the low-power response can be disabled by coupling the Aux_bias node to 3.9 volts via an ideal switch in the simulation 200).

In the simulation 200 for illustrating a current-starved response of the comparator 100 to a large input signal transition, the waveform INM 210 is initially asserted at a ground potential (e.g., 0 volts) and the waveform INP 220 is initially asserted at around 2.90 volts. Because the magnitude of the waveform INP 220 is greater than the magnitude of the waveform INM 210 (e.g., under steady-state conditions), the waveform Comp_Out 230 is initially a logic one (e.g., a logic high level, which is represented here as a voltage greater than 1.42 volts, for example).

The waveform Source 240 indicates the voltage of the common source node 114 is initially driven to around 1.2 volts in response to the current sourced by a first current source (e.g., current source I1), and in response the currents selectively controlled by transistors Q1 and Q2. For example, the waveform Source 240 is driven to around 1.2 volts in response to the waveform INM 210 being at ground potential (e.g., which strongly biases Q2 to conduct), in response to the waveform INP 220 being at around 2.90 volts (e.g., which moderately biases Q1 to conduct), and in response to the commonly controlled current mirror of Q3 and Q4 (e.g., which are commonly biased via the resistor network of R1 and R2).

The waveform Aux_bias 250 is initially driven to a value of around 3.90 volts in response to the current source I2. The low-power enhanced response of the example comparator to a large input signal transition can be disabled in response to a simulation parameter (e.g., a feedback signal to generate the low-power response can be disabled by coupling the Aux_bias node to 3.9 volts via an ideal switch in the simulation 200).

During operation of the comparator 100, the feedback signal of the replica input transistor pair 120 circuit can be a voltage developed in response to the "tail" current of the replica input transistor pair 120 circuit. In the simulation 200, the feedback signal is decoupled (e.g., as a function of a simulation 200 input parameter) from the waveform Aux_bias 250 (when the transistor Q8 is in the off state). The feedback signal is disabled (e.g., by turning off Q8 in response to a simulation 200 input parameter), so that, for example, a response of the comparator 100 with a disabled low power enhancement can be seen. Without the described low power selected current-boost enhancement being enabled in the example, the simulation 200 of the comparator 100 shows a long latency (e.g., around 230 nanoseconds) of the voltage (e.g., waveform Source 240) of the common source node 114 rising to a steady-state level.

The waveform Aux_bias 250 is coupled to the control terminal (e.g., gate) of the transistor Q7. The transistor Q7 is arranged as a programmable (e.g., programmable in response to a gate voltage) current source for selectively applying current to the common source node 114. In the simulation 200, the transistor Q7 is biased (in response to a simulation 200 input) against selectively applying current to the common source node 114 (e.g., applying current in response to the feedback signal generated by the replica input transistor pair 120 circuit). Because the waveform Aux_bias 250 is around 3.90 volts, the PMOS transistor Q7 is in the off state, so that no boost current is injected by the current source Q7 into the common source node 114 (of Q1 and Q2, for example).

At 10 microseconds into the simulation 200, the waveform INM 210 is driven (e.g., as a simulation 200 input parameter) to undergo a large voltage transition 212 from a ground potential to a voltage around 2.92 volts (e.g., which is close to—but greater than—the contemporaneous voltage of the waveform INP 220). The transition 212 of waveform INM 210 causes transients 222 and 252 (for example, via parasitic coupling and/or "ground bounce").

In the response to the transition 212, the gate voltage of transistor Q1 is raised to around 2.92 volts. Accordingly, the gate voltage of Q1 (after transition 212) is higher than the contemporaneous gate voltage of Q2. The current source I1 is designed to source current at a low maximum (e.g., by design, to save power). The low level of the maximum current can result in a current-starved response, which contributes to the latency (e.g., delay) of the voltage rise (during transition 242) of the common source node 114. The waveform Source 240 during transition 242 is raised (e.g., slowly) in response to the limited current that is sourced by the current source I1, the common source node 114 capacitance, and the current drained by the current mirror that includes transistors Q3 and Q4.

Parasitic conditions of the structures forming the common source node 114 (e.g., of Q1 and Q2) impede a rise (e.g., instantaneous rise) in the voltage of the common source node 114. Accordingly, the slew rate of the transition 242 is limited, and the rise of the waveform Source 240 to around 3.6 volts is achieved with a latency of around 200 nanoseconds. (In the simulation described hereinbelow with respect to FIG. 3, a low-power enhanced response can decrease the latency of the voltage rise of the common source node 114 by 140 nanoseconds for similar characteristics of the waveform INM 210 and the waveform INP 220).

In the simulation 200, the waveform Comp_Out 230 toggles (e.g., toggles low) in response to the transition 212 of the waveform INM 210 to a voltage greater than the contemporaneous voltage of the waveform INP 220. In response to the transition 212, the waveform Comp_Out 230 toggles from a logic one to a logic zero (where a logic zero is represented as a ground voltage and a logic one is represented as a level near 1.42 volts). The waveform Comp_Out 230 toggles to a logic zero during transition 232, which reaches a logic zero level at time 202 (e.g., around 10.33 microseconds).

At time 202, the simulation 200 approaches a steady-state response. The waveform INM 210 is around 2.92 volts and the waveform INP 220 is around 2.90 volts. The waveform Source 240 is maintained at a voltage of around 3.6 volts after the transition 242. The waveform Aux_bias 250 is maintained at a voltage of around 3.90 volts because the feedback control of the replica input transistor pair 120 circuit is disabled.

The latency of the comparator 100 shown in the simulation 200 can be measured from the start of the transition 212 of the waveform INM 210 to the end of the transition 232 of the waveform Comp_Out 230. When so measured, the latency of the comparator 100 in the simulation 200 is around 330 nanoseconds, where the simulation 200 includes disabling the feedback control of the replica input transistor pair 120 circuit. In the simulation described hereinbelow with respect to FIG. 3 (in which the feedback control of the replica input transistor pair 120 circuit is not disabled as a simulation parameter), the latency of the comparator 100 in the simulation 200 is reduced to around 124 nanoseconds.

Figure 3:
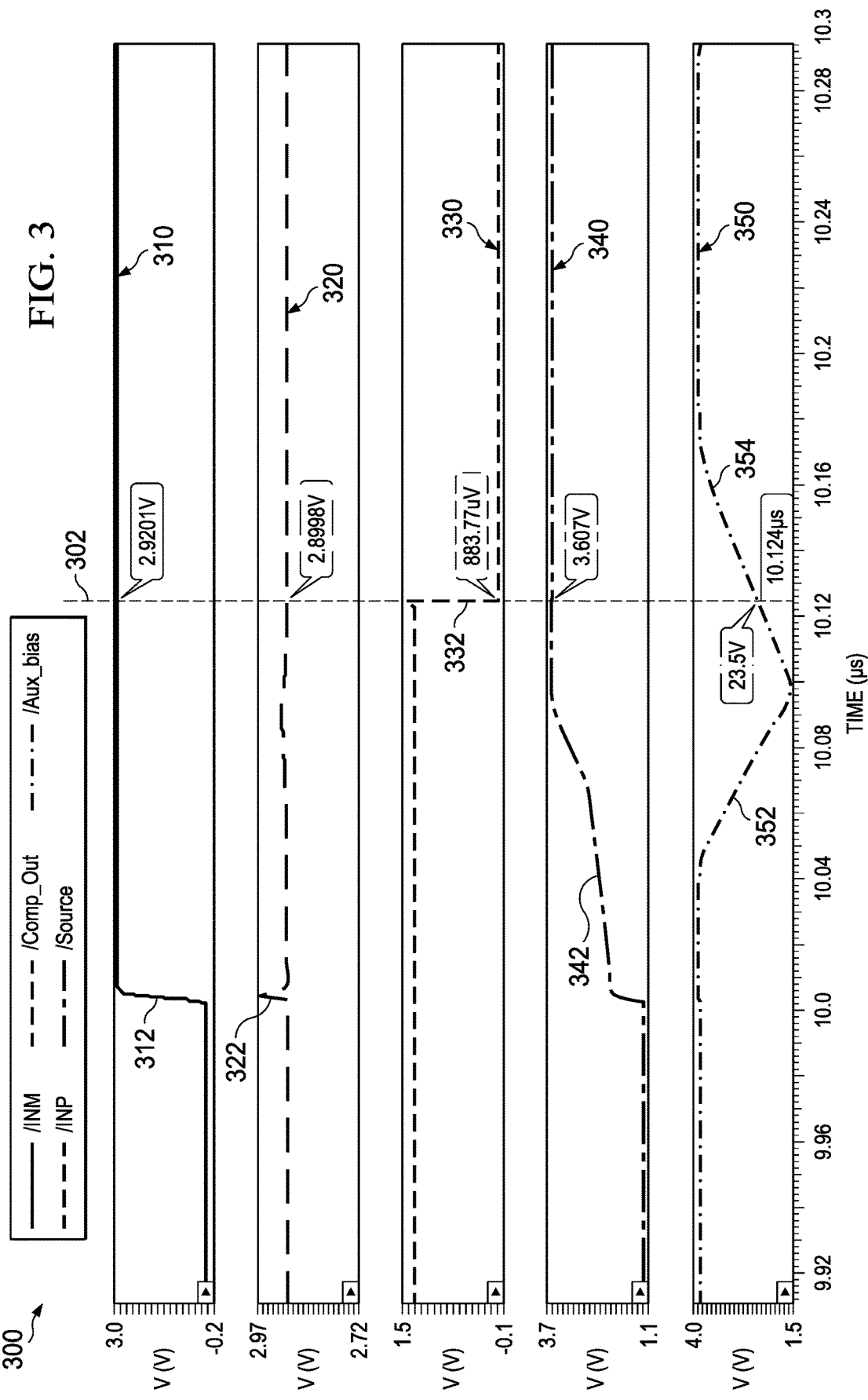
FIG. 3 is a waveform diagram of an example simulation of a low-power response of the example comparator to a large input signal transition.

FIG. 3 is a waveform diagram of an example simulation of a low-power enhanced response of the example comparator to a large input signal transition. The example simulation 300 includes waveforms for showing an example operation of portions of the comparator 100, described hereinabove with reference to FIG. 1. The example waveforms include: the waveform INM 310, the waveform INP 320, the waveform Comp_Out 330, the waveform Source 340, and the waveform Aux_bias 350. The low-power enhanced response of the example comparator to a large input signal transition is enabled in the simulation 300.

In the simulation 300 for illustrating a current-boost response of the comparator 100 to a large input signal transition, the waveform INM 310 is initially asserted at a ground potential (e.g., 0 volts) and the waveform INP 320 is initially asserted at around 2.90 volts. Because the magnitude of the waveform INP 320 is greater than the magnitude of the waveform INM 310 (e.g., under steady-state conditions), the waveform Comp_Out 330 is initially a logic one (e.g., 1.42 volts).

The waveform Source 340 (Common_Source_Node) indicates the voltage of the common source node 114 is initially driven to around 1.2 volts in response to the current sourced by a first current source (e.g., current source I1), and in response the currents selectively controlled by transistors Q1 and Q2. For example, the waveform Source 340 is driven to around 1.2 volts in response to the waveform INM 310 being at ground potential (e.g., which strongly biases Q2 to conduct), in response to the waveform INP 320 being at around 2.90 volts (e.g., which moderately biases Q1 to conduct), and in response to the commonly controlled current mirror of Q3 and Q4.

At 10 microseconds into the simulation 300, the waveform INM 310 is driven to undergo a large voltage transition 312 from a ground potential to a voltage around 2.92 volts. The transition 312 of waveform INM 310 causes transient 322.

In response to the transition 312, the gate voltage of transistor Q1 is raised to around 2.92 volts. Accordingly, the gate voltage of Q1 (after transition 312) is higher than the contemporaneous gate voltage of Q2. The low level of the current maximum of current source I1 can result in a current-starved response, which contributes to the latency of the voltage rise (during transition 342) of the common source node 114. The waveform Source 340 during transition 342 is raised (e.g., slowly) in response to the limited current that is sourced by the current source I1, the common source node 114 capacitance, and the current drained by the current mirror that includes transistors Q3 and Q4.

The replica input transistor pair 120 (e.g., being coupled to the inputs of the input transistor pair 112) detects the current-starved condition of the common source node 114. In response to the current-starved condition, the tail current of the replica input transistor pair 120 is decreased. In response to the decrease of the tail current of the replica input transistor pair 120, less current is added to the current flowing through the drain of Q9. In response to less current being added to the current flowing through Q9, the voltage (waveform Aux_bias 350) of the source of Q8 falls (e.g., as transition 352). For example, the transition 352 begins at around 40 nanoseconds after the beginning of the current-starved condition.

As the waveform Aux_bias 350 falls, the PMOS transistor (e.g., switch) Q7 increases conductivity and adds current (via the current switch 140) to the common source node 114. Adding current via Q7 of the current switch 140 to the common source node 114 reduces the current-starved condition at the common source node 114 and accelerates the rise of the waveform Source 340 during transition 342.

As the waveform Source 340 rises to a steady-state level (e.g., 3.6 volts) around the end of transition 342, the current-starved condition of the common source node 114 is lessened. The replica input transistor pair 120 detects the reduction of the current-starved condition of the common source node 114, and the tail current of the replica input transistor pair 120 is increased. In response to the increase of the tail current of the replica input transistor pair 120, more current is added to the current flowing through the drain of Q9. In response to more current being added to the current flowing through Q9, the voltage (e.g., waveform Aux_bias 350) of the source of Q8 rises (e.g., as transition 354). For example, the transition 354 begins in response to the waveform Source 340 rising to a steady-state level (e.g., which occurs at around 98 nanoseconds after the beginning of the current-starved condition in the simulation 300).

As the waveform Aux_bias 350 rises during the transition 354, the PMOS transistor (e.g., switch) Q7 decreases conductivity and progressively adds less current (e.g., sourced from the current switch 140) to the common source node 114. The waveform Aux_bias 350 rises to a steady-state level (e.g., 3.6 volts) after the comparator 100 responds (e.g., correctly responds) to the relative change in the first input signal that occurs at 10 microseconds into the simulation 300.

In the simulation 300, the waveform Comp_Out 330 toggles in response to the transition 312 of the waveform INM 310 to a voltage greater than the contemporaneous voltage of the waveform INP 320. In response to the transition 312, the waveform Comp_Out 330 toggles from a logic one to a logic zero. The waveform Comp_Out 330 toggles to a logic zero during transition 332, which reaches a logic zero level at time 302 (e.g., around 10.124 microseconds).

After time 302, the simulation 300 approaches a steady-state response. The waveform INM 310 is around 2.92 volts and the waveform INP 320 is around 2.90 volts. The waveform Source 340 reaches and is maintained at a steady-state voltage of around 3.60 volts after the transition 342.

The latency of the comparator 100 shown in the simulation 300 can be measured from the start of the transition 312 of the waveform INM 310 to the end of the transition 332 of the waveform Comp_Out 330. When so measured, the latency of the comparator 100 in the simulation 300 is shortened to around 124 nanoseconds by the described current boost that is added by the current switch 140. The latency of simulation 300 is 176 nanoseconds faster than the latency of 330 nanoseconds of the simulation 200, in which the feedback control of the replica input transistor pair 120 circuit is disabled (e.g., in response to a simulation 200 parameter input).

Figure 4:
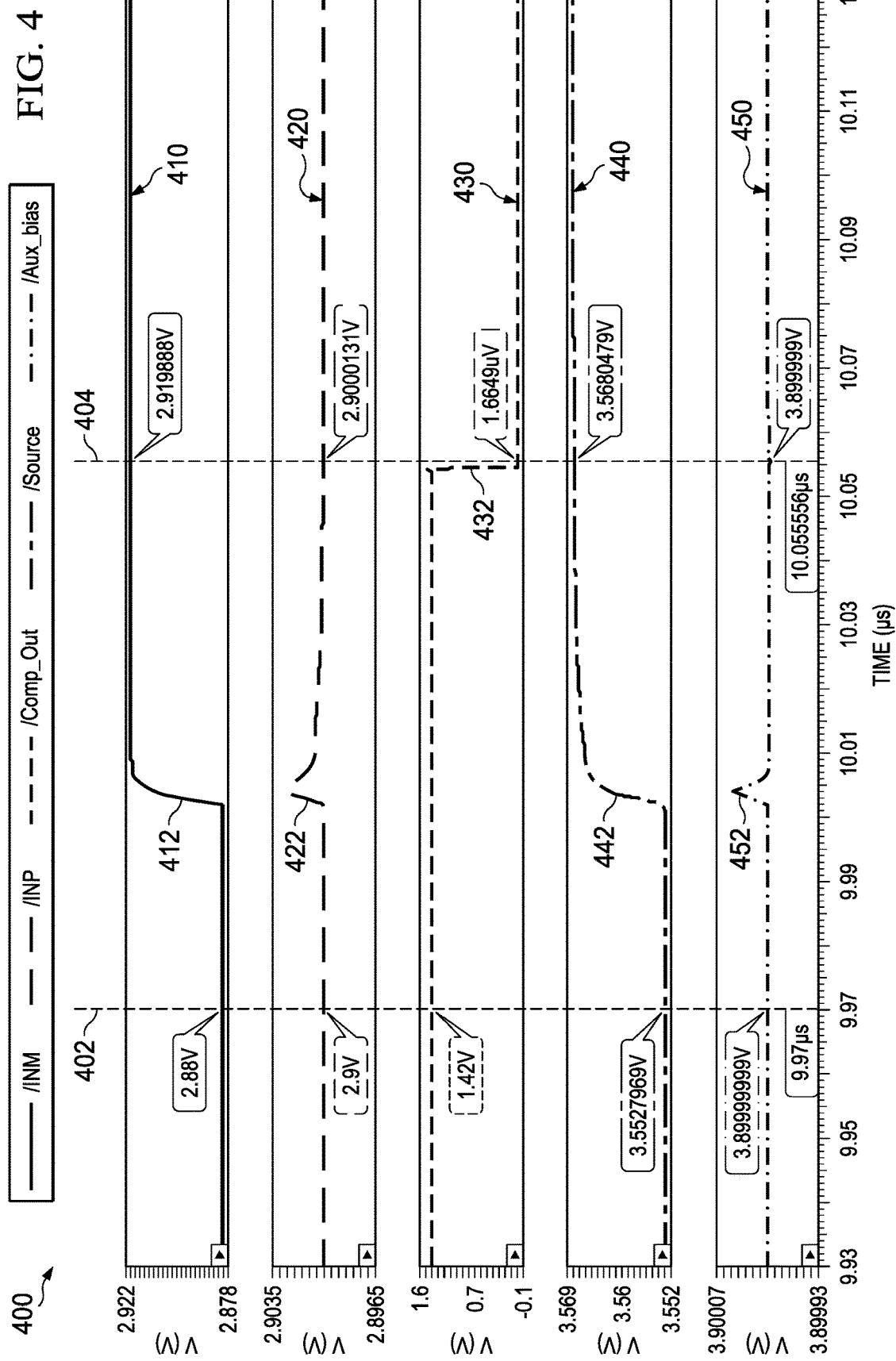
FIG. 4 is a waveform diagram of an example simulation of a disabled low-power response of the example comparator to a small input signal transition.

FIG. 4 is a waveform diagram of an example simulation of a disabled low-power enhanced response of the example comparator to a small input signal transition. The example simulation 400 includes waveforms for showing an example operation of portions of the comparator 100, described hereinabove with reference to FIG. 1. The example waveforms include the waveform INM 410, the waveform INP 420, the waveform Comp_Out 430, the waveform Source 440, and the waveform Aux_bias 450. The low-power enhanced response of the example comparator to a small input signal transition can be disabled in response to a simulation parameter (e.g., a feedback signal to generate the low-power response can be disabled by coupling the Aux_bias node to 3.9 volts via an ideal switch in the simulation 400.

In the simulation 400 for illustrating a current-starved response of the comparator 100 to a small input signal transition, the waveform INM 410 is initially asserted (e.g., before time 402) at a potential of 2.88 volts and the waveform INP 420 is initially asserted at around 2.90 volts. Because the magnitude of the waveform INP 420 is greater than the contemporaneous magnitude of the waveform INM 410 (e.g., under steady-state conditions), the waveform Comp_Out 430 is initially a logic one (e.g., 1.42V).

The waveform Source (Common_Source_Node) 440 indicates the voltage of the common source node 114 is initially driven to around 3.55 volts in response to the current sourced by a first current source (e.g., current source I1), and in response the currents selectively controlled by transistors Q1 and Q2. For example, the waveform Source 440 is driven to around 3.55 volts in response to the waveform INM 410 being at 2.88 volts, in response to the waveform INP 420 being at around 2.90 volts, and in response to the commonly controlled current mirror of Q3 and Q4 (e.g., which are commonly biased via the resistor network of R1 and R2).

The waveform Aux_bias 450 is driven to a value of around 3.90 volts in response to the current source I2. The low-power enhanced response of the example comparator to a small input signal transition can be disabled in response to a simulation parameter (e.g., a feedback signal to generate the low-power response can be disabled by coupling the Aux_bias node to 3.9 volts via an ideal switch in the simulation 400).

During operation of the comparator 100, the feedback signal of the replica input transistor pair 120 circuit can be a voltage developed in response to the tail current of the replica input transistor pair 120 circuit. In the simulation 400, the feedback signal is decoupled (e.g., as a function of a simulation 400 input parameter) from modulating the waveform Aux_bias 450. The feedback signal is disabled (e.g., by turning off Q8 in response to a simulation 400 input parameter), so that, for example, a response of the comparator 100 with a disabled low power enhancement can be seen. Without the described low power selected current-boost enhancement being enabled in the example, the simulation 400 of the comparator 100 shows a latency (e.g., around 40 nanoseconds) of the voltage (e.g., waveform Source 440) of the common source node 114 rising to a steady-state level.

The waveform Aux_bias 450 is coupled to the control terminal (e.g., gate) of the transistor Q7. The transistor Q7 is arranged as a programmable (e.g., programmable in response to a gate voltage) current source for selectively applying current to the common source node 114. In the simulation 400, the transistor Q7 is disabled (in response to a simulation 400 input) against selectively applying current to the common source node 114 (e.g., applying current in response to the feedback signal generated by the replica input transistor pair 120 circuit). Because the waveform Aux_bias 450 is around 3.90 volts, the PMOS transistor Q7 is in the off state, so that no boost current is injected by the current source Q7 into the common source node 114 (of Q1 and Q2, for example).

At 10 microseconds into the simulation 400, the waveform INM 410 is driven (e.g., as a simulation 400 input parameter) to undergo a small voltage transition 412 from a voltage of 2.88 volts to a voltage around 2.92 volts. The transition 412 of waveform INM 410 causes transients 422 and 452.

In response to the transition 412, the gate voltage of transistor Q2 is raised to around 2.92 volts. Accordingly, the gate voltage of Q2 (after transition 412) is higher than the contemporaneous gate voltage of Q1. The current source I1 is designed to source current at a low maximum (e.g., to save power). The low level of the maximum current can result in a current-starved response, which contributes to the latency of the voltage rise (during transition 442) of the common source node 114. The waveform Source 440 during transition 442 is raised (e.g., slowly) in response to the limited current that is sourced by the current source I1, the common source node 114 capacitance, and the current drained by the current mirror that includes transistors Q3 and Q4.

Parasitic conditions of the structures forming the common source node 114 (e.g., of Q1 and Q2) impede a rise (e.g., instantaneous rise) in the voltage of the common source node 114. Accordingly, the slew rate of the transition 442 is limited, and the rise of the waveform Source 440 to around 3.6 volts is achieved with a latency of around 40 nanoseconds.

In the simulation 400, the waveform Comp_Out 430 toggles in response to the transition 412 of the waveform INM 410 to a voltage greater than the contemporaneous voltage of the waveform INP 420. In response to the transition 412, the waveform Comp_Out 430 toggles from a logic one to a logic zero. The waveform Comp_Out 430 toggles to a logic zero during transition 432, which reaches a logic zero level around 1 nanosecond before time 404 (e.g., where time 404 is 10.056 microseconds).

At time 404, the simulation 400 approaches a steady-state response. The waveform INM 410 is around 2.92 volts and the waveform INP 420 is around 2.90 volts. The waveform Source 440 is maintained at a voltage of around 3.57 volts after the transition 442. The waveform Aux_bias 450 is maintained at a voltage of around 3.90 volts because the feedback control of the replica input transistor pair 120 circuit is disabled.

The latency of the comparator 100 shown in the simulation 400 can be measured from the start of the transition 412 of the waveform INM 410 to the end of the transition 432 of the waveform Comp_Out 430. When so measured, the latency of the comparator 100 in the simulation 400 is around 55 nanoseconds, where the simulation 400 includes disabling the feedback control of the replica input transistor pair 120 circuit. In the simulation described hereinbelow with respect to FIG. 5 (in which the feedback control of the replica input transistor pair 120 circuit is not disabled as a simulation parameter), the latency of the comparator 100 in the simulation 500 is similar to the latency of the comparator 100 in the simulation 400.

Figure 5:
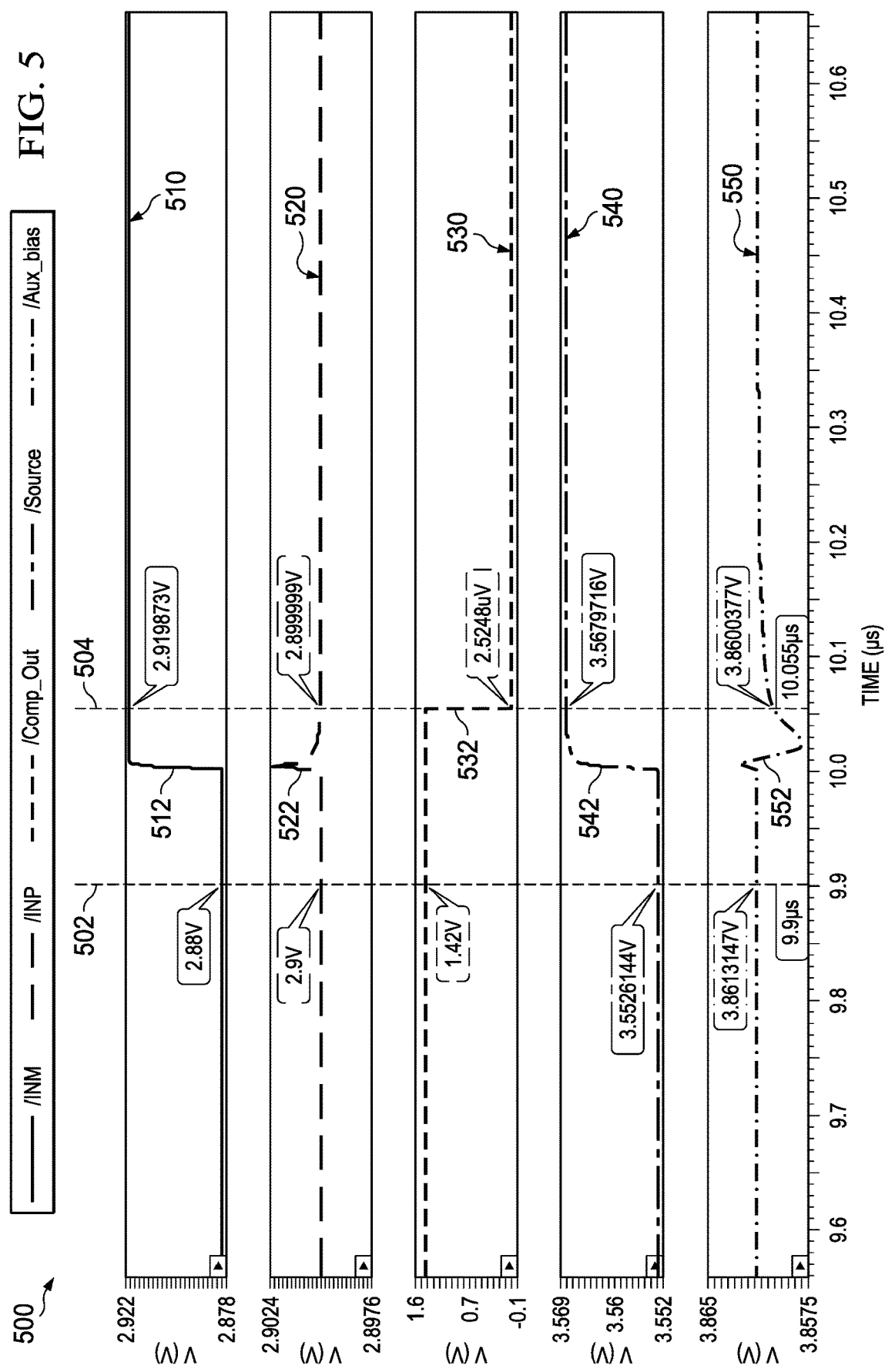
FIG. 5 is a waveform diagram of an example simulation of a low-power response of the example comparator to a small input signal transition.

FIG. 5 is a waveform diagram of an example simulation of a low-power enhanced response of the example comparator to a small input signal transition. The example simulation 500 includes waveforms for showing an example operation of portions of the comparator 100, described hereinabove with reference to FIG. 1. The example waveforms include: the waveform INM 510, the waveform INP 520, the waveform Comp_Out 530, the waveform Source 540, and the waveform Aux_bias 550. The low-power enhanced response of the example comparator to a small input signal transition is enabled in the simulation 500. Under the initial conditions, the waveform Aux_bias is a logic one, so that the transistor Q7 is turned off, and so that Q7 does not (initially) inject a boost current into the common source node 114.

In the simulation 500 for illustrating a current-boost response of the comparator 100 to a small input signal transition, the waveform INM 510 is initially asserted (e.g., before time 502) at a potential of 2.88 volts and the waveform INP 520 is initially asserted at around 2.90 volts. Because the magnitude of the waveform INP 520 is greater than the magnitude of the waveform INM 510 (e.g., under steady-state conditions), the waveform Comp_Out 530 is initially a logic one (e.g., 1.42 volts).

The waveform Source (Common_Source_Node) 540 indicates the voltage of the common source node 114 is initially driven (e.g., before time 502) to around 3.55 volts in response to the current sourced by a first current source (e.g., current source I1), and in response the currents selectively controlled by transistors Q1 and Q2. For example, the waveform Source 540 is driven to around 3.55 volts in response to the waveform INM 510 being at 2.88 volts, in response to the waveform INP 520 being at around 2.90 volts, and in response to the commonly controlled current mirror of Q3 and Q4.

At 10 microseconds into the simulation 500 (e.g., at time 502), the waveform INM 510 is driven to undergo a small voltage transition 512 from a voltage of 2.88 volts to a voltage around 2.92 volts. The transition 512 of waveform INM 510 causes transient 522.

In response to the transition 512, the gate voltage of transistor Q2 is raised to around 2.92 volts. Accordingly, the gate voltage of Q2 (after transition 512) is higher than the contemporaneous gate voltage of Q1. The low level of the current maximum of current source I1 can result in a current-starved response, which contributes to the latency of the voltage rise (during transition 542) of the common source node 114. The waveform Source 540 during transition 542 is raised in response to the limited current that is sourced by the current source I1, the common source node 114 capacitance, and the current drained by the current mirror that includes transistors Q3 and Q4.

The replica input transistor pair 120 (e.g., being coupled to the inputs of the input transistor pair 112) detects the current-starved condition of the common source node 114. In response to the current-starved condition, the tail current of the replica input transistor pair 120 is decreased. In response to the decrease of the tail current of the replica input transistor pair 120, less current is added to the current flowing through the drain of Q9. In response to less current being added to the current flowing through Q9, the voltage (waveform Aux_bias 550) of the source of Q8 falls (e.g., as transition 552). For example, the transition 552 begins at around 10 nanoseconds after the beginning of the current-starved condition.

As the waveform Aux_bias 550 falls, the PMOS transistor (e.g., switch) Q7 increases conductivity and adds current (from the current switch 140) to the common source node 114. In the simulation 500, the resulting current-starved condition is small (e.g., because of the small voltage change of the waveform INM 510, and the added current from the current switch Q7 to the common source node 114 does not readily noticeably accelerate (at the scale shown in FIG. 5) the rise of the waveform Source 540 during transition 542. As described hereinbelow, the transition 552 does not readily noticeably turn on transistor Q7 for adding supplemental current to the common source node 114.

In the simulation 500, the waveform Comp_Out 530 toggles in response to the transition 512 of the waveform INM 510 to a voltage greater than the contemporaneous voltage of the waveform INP 520. In response to the transition 512, the waveform Comp_Out 530 toggles from a logic one to a logic zero. The waveform Comp_Out 530 toggles to a logic zero during transition 532, which reaches a logic zero level at time 504 (e.g., around 10.055 microseconds).

At time 504, the simulation 500 the waveform INM 510 is around 2.92 volts, the waveform INP 520 is around 2.90 volts, and the waveform Source 540 reaches and is maintained at a steady-state voltage of around 3.6 volts after the transition 542.

The latency of the comparator 100 shown in the simulation 500 can be measured from the start of the transition 512 of the waveform INM 510 to the end of the transition 532 of the waveform Comp_Out 530. As shown in FIG. 5, the latency of the comparator 100 in the simulation 500 is can be compared to the latency of the comparator 100 in the simulation 400 (described hereinabove).

Figure 6:
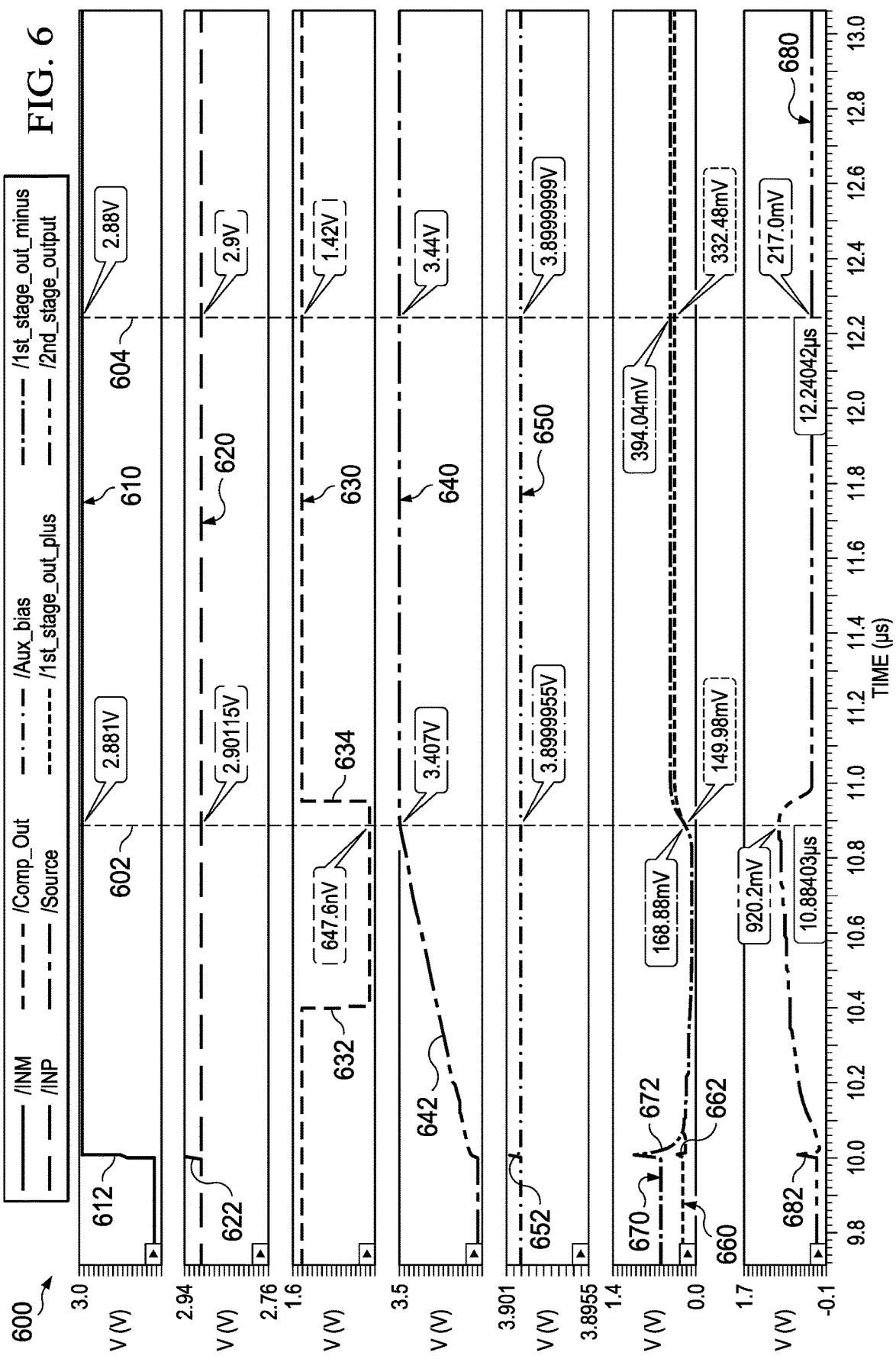
FIG. 6 is a waveform diagram of another example simulation of a disabled low-power response of the example comparator to a large input signal transition.

FIG. 6 is a waveform diagram of another example simulation of a disabled low-power enhanced response of the example comparator to a large input signal transition. The example simulation 600 includes waveforms for showing an example operation of portions of the comparator 100, described hereinabove with reference to FIG. 1. The example waveforms include the waveform INM 610, the waveform INP 620, the waveform Comp_Out 630, the waveform Source 640, the waveform Aux_bias 650, the waveform 1st_stage_out_plus 660, the waveform 1st_stage_out_minus 670, and the waveform 2nd_stage_output 680. The transistor Q8 is turned off by a simulation 600 parameter to disable a feedback signal (e.g., via the waveform Aux_bias 650) for controlling the current boosting of Q7.

The simulation 600 shows a current-starved response of a common source node 114 of the comparator 100 to a first input signal change to a first value that is substantially close to a second value of a second input signal. For example, a first input signal value is substantially close to a second input signal value when the difference therebetween is a value within the input offset of the amplifier that receives the first and second input signals.

In the simulation 600, the waveform INM 610 is initially asserted (e.g., before the 10-microsecond mark of the simulation 600) at a ground potential (e.g., 0 volts), whereas the waveform INP 620 is initially asserted at around 2.90 volts. Because the initial magnitude of the waveform INP 620 is greater than the contemporaneous magnitude of the waveform INM 610 (e.g., under initial steady-state conditions), the waveform Comp_Out 630 is initially a logic one (e.g., 1.42V). The waveform Comp_Out 630 is generated in response to the difference between the waveform 1st_stage_out_minus 670 and the waveform 1st_stage_out_plus 660, where the difference is indicated by the waveform 2nd_stage_output 680 described hereinbelow.

The waveform Source (Common_Source_Node) 640 indicates the voltage of the common source node 114 is initially driven to a low voltage (e.g., 1.2 volts) in response to the current sourced by a first current source (e.g., current source I1), and in response the currents selectively controlled by transistors Q1 and Q2. For example, the waveform Source 640 is driven to a low voltage (e.g., 1.2 volts) in response to the waveform INM 610 being at ground, in response to the waveform INP 620 being at around 2.90 volts, and in response to the commonly controlled current mirror of Q3 and Q4 (e.g., which are commonly biased via the resistor network of R1 and R2).

The waveform Aux_bias 650 is driven to a value of around 3.90 volts in response to the current source I2. The low-power enhanced response of the example comparator to a large input signal transition can be disabled in response to a simulation parameter (e.g., a feedback signal to generate the low-power response can be disabled by coupling the Aux_bias node to 3.9 volts via an ideal switch in the simulation 600).

During operation of the comparator 100, the feedback signal of the replica input transistor pair 120 circuit can be a voltage developed in response to the tail current of the replica input transistor pair 120 circuit. In the simulation 600, the feedback signal is decoupled (e.g., in response to a simulation 600 input parameter) from the waveform Aux_bias 650. The feedback signal is disabled (e.g., in response to a simulation 600 input parameter), so that, for example, a response of the comparator 100 with a disabled low power enhancement can be seen. For example, a deficit of "robust" operation (e.g., a susceptibility to generating erroneous outputs) can be demonstrated by the example spurious output pulse of the waveform Comp_Out 630 (e.g., where the spurious pulse includes transitions 632 and 634).

The waveform Aux_bias 650 is coupled to the control terminal (e.g., gate) of the transistor Q7. The transistor Q7 is arranged as a programmable (e.g., programmable in response to a gate voltage) current source for selectively applying current to the common source node 114. In the simulation 600, the transistor Q7 is disabled (in response to a simulation 600 input) against selectively applying current to the common source node 114 (e.g., applying current in response to the feedback signal generated by the replica input transistor pair 120 circuit). Because the waveform Aux_bias 650 is around 3.90 volts throughout the simulation 600, the PMOS transistor Q7 is in the off state, so that no boost current is injected by the current source Q7 into the common source node 114 (of Q1 and Q2, for example).

The waveform 1st_stage_out_plus 660 and the waveform 1st_stage_out_minus 670 are developed in response to the first input signal and the second input signal, respectively. For example, the waveform 1st_stage_out_plus 660 is initially around 169 millivolts (in response to the waveform INM 610), and the waveform 1st_stage_out_minus 670 is around 550 millivolts (in response to the waveform INP 620).

The second stage 150 generates the waveform 2nd_stage_output 680 in response to the difference between the waveform 1st_stage_out_plus 660 and the waveform 1st_stage_out_minus 670 (where the waveform 1st_stage_out_plus 660 and the waveform 1st_stage_out_minus 670 are first stage 110 output signals). The difference between the initial voltage values of the waveform 1st_stage_out_plus 660 and the waveform 1st_stage_out_minus 670 is greater than an input offset of the second stage 150 input transistors Q12 and Q13 (e.g., which entails a reduced probability of an output error). When the difference between the initial voltage values of the waveform 1st_stage_out_plus 660 and the waveform 1st_stage_out_minus 670 is not greater than an input offset of the second stage 150, the second stage is susceptible to outputting an erroneous output (as described hereinbelow).

In response to the difference of the input signals, the waveform 2nd_stage_output 680 is initially a voltage (e.g., a ground or a near-ground potential) for indicating that the magnitude of the waveform 1st_stage_out_plus 660 is less than the waveform 1st_stage_out_minus 670. The waveform 2nd_stage_output 680 value (e.g., initially at ground potential) is received by the third stage 160 and is quantized by an input gate of the third stage 160 (e.g., initially as an input logic zero). The third stage 160 buffers and inverts the input logic zero and outputs the buffered inverted value as the waveform Comp_Out 630 (e.g., which initially is a logic one).

At 10 microseconds into the simulation 600, the waveform INM 610 is driven (e.g., as a simulation 600 input parameter) to undergo a large voltage transition 612 from a ground potential to a voltage around 2.88 volts. The rise of the waveform INM 610 to the voltage around 2.88 volts is a level that continues to be less than the magnitude of the waveform INP 620 (e.g., 2.90 volts), so the waveform Comp_Out 630 is ideally (e.g., without logical error) expected to not toggle (e.g., change output logic state). The transition 612 of waveform INM 610 causes transients 622, 652, 662, 672, and 682.

During the transition 612, the gate voltage of transistor Q2 is raised to around 2.88 volts. After the transition 612, the gate voltage of Q2 remains lower than the contemporaneous gate voltage of Q1 (e.g., so that the waveform Comp_Out 630 does not properly toggle). The current source I1 is designed to source current to the Common_Source_Node (e.g., waveform Source 640) at a low maximum current (e.g., by design, to save power). The low level of the maximum current results in a current-starved response (e.g., in response to the transition 612), which contributes to the latency of the voltage rise of transition 642.

The current-starved-induced latency (e.g., which occurs during transition 642) of the common source node 114 of the first stage 110 also contributes to the latency of the settling of the waveforms 1st_stage_out_plus 660 and the 1st_stage_out_minus 670. For example, after the transients 662 and 672, the voltages of the waveforms 1st_stage_out_plus 660 and the 1st_stage_out_minus 670 converge to a difference of less than an input offset of the second stage 150 amplifier (which can lead to an erroneous output of the second stage 150).

The convergence of the waveform 1st_stage_out_plus 660 and the 1st_stage_out_minus 670 to low voltages (e.g., near ground) helps ensure that the NMOS transistors Q12 and Q13 are more negatively biased, so that the transistors Q12 and Q13 do not conduct strongly. When the transistors Q12 and Q13 do not conduct strongly during the current-starved condition (e.g., during transition 642), the waveform 2nd_stage_output 680 rises (e.g., gradually rises in response to a drain current generated by the current mirror formed by the transistors Q10 and Q11).

As the waveform 2nd_stage_output 680 rises in the simulation 600, the second stage 150 output (logically erroneously) reaches a voltage (e.g., 900 millivolts) that can be quantized by the third stage 160 as a logic one. The third stage 160 inverts the received logic one value, which causes the third stage 160 to toggle low at transition 632. The transition of the third stage 160 output to toggle is erroneous because the input signal having the greatest magnitude of the first and second input signals (e.g., the waveform INM 610 and the waveform INP 620) has not changed. Such errors can lead to incorrect processing of data, so that the incorrect processing can result in corrupted output data or other processing errors. When the comparator is used in a feedback loop for controlling an external (e.g., to the comparator 100) process (for example), the external process can interrupt the stability and accuracy of the feedback control signals (including signals within safety-critical systems).

The waveform Source 640 reaches a steady-state value (e.g., near steady-state value) at the end of transition 642. At the end of transition 642 (e.g., at time 602), the current-starved condition is alleviated, so that the waveform 1st_stage_out_plus 660 and the waveform 1st_stage_out_minus 670 rise. As the waveform 1st_stage_out_plus 660 and the waveform 1st_stage_out_minus 670 rise, at least one of the transistors Q12 and Q13 is biased more strongly (e.g., to increase conductivity). As at least one of the transistors Q12 and Q13 is biased more strongly, the output (e.g., waveform 2nd_stage_output 680) of the second stage 150 falls to a level that can be quantized by the third stage 160 as a logic zero. The third stage 160 inverts the received logic zero value, which causes the third stage 160 to toggle high (e.g., back to a logically correct value) at transition 634. The transition 634 of the third stage 160 output restores the correct output value of the comparator 100 (e.g., after the current-starved condition during transition 642 is alleviated).

At time 604, the simulation 600 approaches a steady-state response. The waveform INM 610 is around 2.88 volts and the waveform INP 620 is around 2.90 volts. The waveform Source 640 is maintained at a voltage of around 3.44 volts after the transition 642. The waveform Aux_bias 650 is maintained at a voltage of around 3.90 volts because the feedback control of the replica input transistor pair 120 circuit is disabled. The waveform 1st_stage_out_plus 660 is around 332 millivolts, the waveform 1st_stage_out_minus 670 is around 394 millivolts, and the waveform 2nd_stage_output 680 is around 217 millivolts.

The latency of the comparator 100 during transition 642 can result in erroneous performance (e.g., a logically incorrect output value) during the current-starved condition encountered, for example when at least one input signal undergoes a large transition (while not transitioning to a value for indicating a logically valid transition of the comparator 100). The simulation 600 includes disabling the feedback control of the replica input transistor pair 120 circuit, so that the logically erroneous behavior of a comparator under a current-starved condition can be demonstrated. In the simulation 700 (in which the feedback control of the replica input transistor pair 120 circuit is not disabled as a simulation parameter), the comparator 100 selectively couples current from a current switch (e.g., current switch 140) into the common source node 114 (e.g., to more quickly alleviate the current-starved condition which can otherwise result in the generation of an erroneous output signal).

Figure 7:
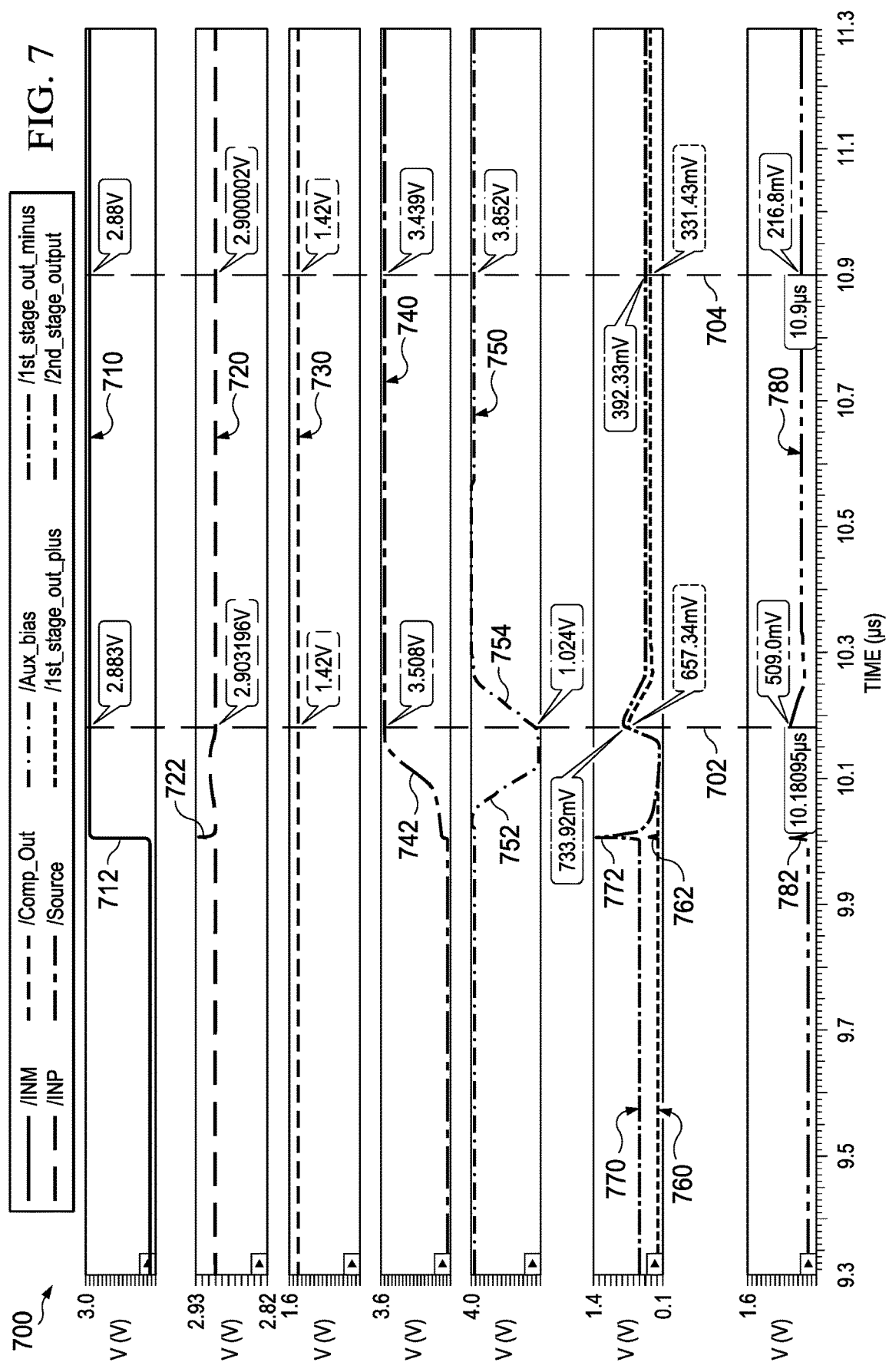
FIG. 7 waveform diagram of another example simulation of an enabled low-power response of the example comparator to a large input signal transition.

FIG. 7 waveform diagram of another example simulation of an enabled low-power enhanced response of the example comparator to a large input signal transition. The example simulation 700 includes waveforms for showing an example operation of portions of the comparator 100, described hereinabove with reference to FIG. 1. The example waveforms include the waveform INM 710, the waveform INP 720, the waveform Comp_Out 730, the waveform Source 740, the waveform Aux_bias 750, the waveform 1st_stage_out_plus 760, the waveform 1st_stage_out_minus 770, and the waveform 2nd_stage_output 780. The low-power enhanced response of the example comparator to a large input signal transition is enabled in the simulation 700.

The simulation 700 shows a current-starved response of the comparator 100 to a voltage transition of a first input signal to a first input signal value within a difference given by the input offset of the amplifier that receives the first and second input signals.

In the simulation 700, the waveform INM 710 is initially asserted (e.g., before the 10-microsecond mark of the simulation 700) at a ground potential, whereas the waveform INP 720 is initially asserted at around 2.90 volts. Because the initial magnitude of the waveform INP 720 is greater than the contemporaneous magnitude of the waveform INM 710 (e.g., under initial steady-state conditions), the waveform Comp_Out 730 is initially a logic one (e.g., 1.42V). The waveform Comp_Out 730 is generated in response to the difference between the waveform 1st_stage_out_minus 770, and the waveform 2nd_stage_output 780 described hereinbelow.

The waveform Source (Common_Source_Node) 740 indicates the voltage of the common source node 114 is initially driven to a low voltage (e.g., 1.2 volts) in response to the current sourced by a first current source (e.g., current source I1), and in response the currents selectively controlled by transistors Q1 and Q2. For example, the waveform Source 740 is driven to a low voltage (e.g., 1.2 volts) in response to the waveform INM 710 being at ground, in response to the waveform INP 720 being at around 2.90 volts, and in response to the commonly controlled current mirror of Q3 and Q4.

The waveform Aux_bias 750 is driven to a value of around 3.90 volts in response to the current source 12. The waveform Aux_bias is not affected by the Replica_load feedback signal of the replica input transistor pair 120 circuit because the replica input transistor pair 120 circuit does not (under initial conditions) detect a current starved condition of the common source node 114. The transistor Q8 is biased to be on in response to the signal NCAS ("normalize cascode," shown in FIG. 1). When the transistor Q8 is in the on state, the feedback path (e.g., including signal Replica_load, the first and second current terminals of transistor Q8, and the signal Aux_bias) of the feedback signal of the replica input transistor pair 120 circuit are coupled as a feedback circuit (e.g., for coupling a feedback signal to the common source node 114).

During operation of the comparator 100, the feedback signal of the replica input transistor pair 120 circuit can be a voltage developed in response to the tail current of the replica input transistor pair 120 circuit. In the simulation 700, the feedback signal is coupled to the gate of transistor Q7 (and to the common source node 114 via the drain of Q7), so that, for example, a response of the replica input transistor pair 120 can be seen. For example, a "robust" operation (e.g., an insusceptibility to generating erroneous outputs from input signals having a voltage input less than an input offset of an amplifier) can be demonstrated by the lack of a spurious output pulse (cf., Comp_Out 630) of the waveform Comp_Out 730.

The waveform Aux_bias 750 is coupled to the control terminal (e.g., gate) of the transistor Q7. In the simulation 700, the transistor Q7 is enabled (in response to a simulation 700 input) to selectively apply current to the common source node 114 (e.g., in response to the feedback signal generated by the replica input transistor pair 120 circuit). Because the waveform Aux_bias 750 is initially around 3.90 volts in the simulation 700, the PMOS transistor Q7 is in the off state, so that no boost current is injected by the current source Q7 into the common source node 114 (of Q1 and Q2, for example).

The waveform 1st_stage_out_plus 760 and the waveform 1st_stage_out_minus 770 are developed in response to the first input signal and the second input signal, respectively. For example, the waveform 1st_stage_out_plus 760 is initially around 169 millivolts (in response to the waveform INM 710), and the waveform 1st_stage_out_minus 770 is around 550 millivolts (in response to the waveform INP 720).

In response to the difference of the input signals, the waveform 2nd_stage_output 780 initially indicates the magnitude of the waveform 1st_stage_out_plus 760 is less than the waveform 1st_stage_out_minus 770. The waveform 2nd_stage_output 780 value (e.g., initially at ground potential) is received by the third stage 160 and is quantized by an input gate of the third stage 160 (e.g., initially as an input logic zero). The third stage 160 buffers and inverts the input logic zero and outputs the buffered inverted value as the waveform Comp_Out 730 (e.g., which initially is a logic one).

At 10 microseconds into the simulation 700, the waveform INM 710 is driven (e.g., as a simulation 700 input parameter) to undergo a large voltage transition 712 from a ground potential to a voltage around 2.88 volts. The rise of the waveform INM 710 to the voltage around 2.88 volts is a level that continues to be less than the magnitude of the waveform INP 720, so the waveform Comp_Out 730 ideally (e.g., without error) does not toggle. The transition 712 of waveform INM 710 causes transients 722, 762, 772, and 782.

During the transition 712, the gate voltage of transistor Q1 is raised to around 2.88 volts. After the transition 712, the gate voltage of Q1 remains lower than the contemporaneous gate voltage of Q2 (e.g., so that the waveform Comp_Out 730 does not properly toggle). The current source I1 is designed to source current at a low maximum (e.g., by design, to save power), so that a current-starved response of the first stage 110 is developed.

The current-starved-induced latency (e.g., which occurs during transition 742) of the common source node 114 of the first stage 110 also contributes to the latency of the settling of the waveforms 1st_stage_out_plus 760 and the 1st_stage_out_minus 770. For example, after transients 762 and 772, the voltages of the waveforms 1st_stage_out_plus 760 and the 1st_stage_out_minus 770 converge to a difference of less than an input offset of the second stage 150 amplifier (which can otherwise lead to an erroneous output of the second stage 150).

The convergence of the waveform 1st_stage_out_plus 760 and the 1st_stage_out_minus 770 to low voltages (e.g., near ground) helps ensure that the NMOS transistors Q12 and Q13 are more negatively biased, so that the transistors Q12 and Q13 do not conduct strongly. When the transistors Q12 and Q13 do not conduct strongly during the current-starved condition (e.g., during transition 742), the waveform 2nd_stage_output 780 rises (e.g., gradually rises in response to a drain current generated by the current mirror formed by the transistors Q10 and Q11).

As the second stage 150 output (e.g., the waveform 2nd_stage_output 780) rises in the simulation 700, the second stage 150 output is prevented from reaching a voltage that can be quantized by the third stage 160 as a logic one. As described herein following, the second stage 150 output is prevented from reaching a voltage that would otherwise be quantized by the third stage 160 as a logic one. The rise to the logic one threshold of the second stage 150 output is prevented by the current injection selectively coupled via the current switch 140 (where the current injection alleviates the current-starved condition of the common source node 114).

The replica input transistor pair 120 (e.g., being coupled to the inputs of the input transistor pair 112) detects the current-starved condition of the common source node 114. In response to the current-starved condition, the tail current of the replica input transistor pair 120 is decreased. In response to the decrease of the tail current of the replica input transistor pair 120, less current is added to the current flowing through the drain of Q9. In response to less current being added to the current flowing through Q9, the voltage (waveform Aux_bias 750) of the source of Q8 falls (e.g., as transition 752). For example, the transition 752 begins at around 40 nanoseconds after the beginning of the current-starved condition.

As the waveform Aux_bias 750 falls, the PMOS transistor (e.g., switch) Q7 increases conductivity and adds current (selectively sourced via the current switch 140) to the common source node 114. Adding current via the current switch Q7 to the common source node 114 reduces the current-starved condition at the common source node 114 and accelerates the rise of the waveform Source 740 during transition 742.

As the waveform Source 740 rises to a steady-state level (e.g., 3.6 volts) around the end of transition 742, the current-starved condition of the common source node 114 is lessened. The replica input transistor pair 120 detects the reduction of the current-starved condition of the common source node 114, and the tail current of the replica input transistor pair 120 is increased. In response to the increase of the tail current of the replica input transistor pair 120, more current is added to the current flowing through the drain of Q9. In response to more current being added to the current flowing through Q9, the voltage (e.g., waveform Aux_bias 750) of the source of Q8 rises (e.g., as transition 754). For example, the transition 754 begins in response to the waveform Source 740 rising to a steady-state level (e.g., which occurs at around 98 nanoseconds after the beginning of the current-starved condition in the simulation 700).

As the waveform Aux_bias 750 rises during the transition 754, the PMOS transistor (e.g., switch) Q7 decreases conductivity and progressively adds less current (from the current switch 140) to the common source node 114. The waveform Aux_bias 750 rises to a steady-state level (e.g., 3.6 volts) after the comparator 100 responds (e.g., correctly responds) to the relative change in the first input signal that occurs at 10 microseconds into the simulation 700.

At time 704, the simulation 700 approaches a steady-state response. The waveform INM 710 is around 2.88 volts and the waveform INP 720 is around 2.90 volts. The waveform Source 740 is maintained at a voltage of around 3.44 volts after the transition 742. The waveform Aux_bias 750 is maintained at a voltage of around 3.90 volts because the current switch Q7 is off. The waveform 1st_stage_out_plus 760 is around 331 millivolts, the waveform 1st_stage_out_minus 770 is around 392 millivolts, and the waveform 2nd_stage_output 780 is around 217 millivolts.

In the simulation 700 of the comparator 100, the feedback control of the replica input transistor pair 120 circuit detects the current-starved condition of the common source node 114. In response to an indication of the current-starved condition generated by the replica input transistor pair 120 circuit, the current switch 140 selectively couples current from the current switch 140 into the common source node 114, which accelerates the reduction of the current-starved condition of the common source node 114. Accelerating the reduction of the current-starved condition of the common source node 114 prevents the convergence of the waveforms 1st_stage_out_plus 760 and the 1st_stage_out_minus 770 to a difference of less than an input offset of the second stage 150 amplifier. Inhibiting the convergence of the waveforms 1st_stage_out_plus 760 and the 1st_stage_out_minus 770 converge to a difference of less than an input offset of the second stage 150 amplifier increases the robustness of the comparator against generating erroneous output signals.

Figure 8:
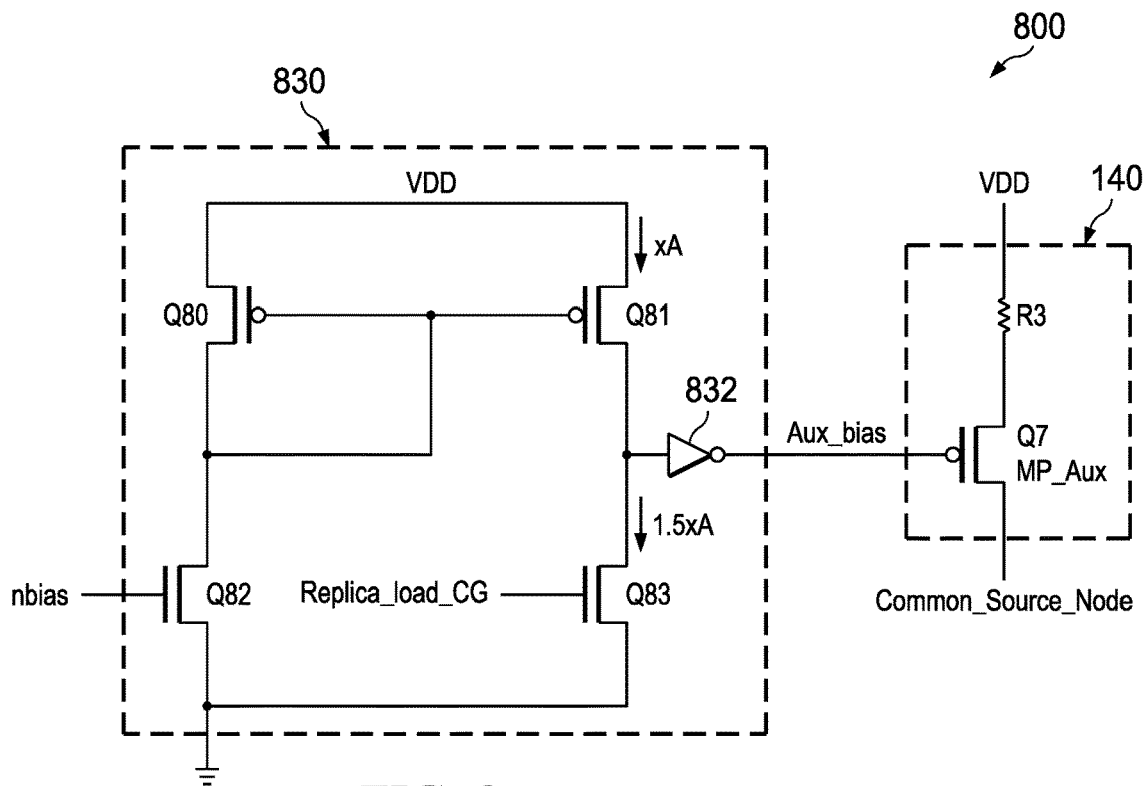
FIG. 8 is a schematic diagram of another example Aux_bias generator for low-power response of the example comparator.

FIG. 8 is a schematic diagram of another example Aux_bias generator for low-power enhanced response of the example comparator. The example Aux_bias generator 830 of circuit 800 includes transistors Q80, Q81, Q82, and Q83 and inverter 832. For example, the Aux_bias generator 830 is similar to the Aux_bias generator 130 described hereinabove.

In at least one implementation, the PMOS transistors Q80 and Q81 are arranged as a current mirror, in which the current flowing through Q80 controls the current flowing through Q81. The current flowing through Q80 is controlled by the bias signal nbias, so that the NMOS transistor Q81 is biased to conduct (e.g., opens a channel for carrying) a first current "A" of magnitude "x" (e.g., xA). The Replica_load_CG signal (e.g., the gate control signal of Q3 and Q4 generated by the first stage 110) is coupled to bias the NMOS transistor Q83 in response to the replica input transistor pair 120 circuit for detecting a current-starved condition.

When the Replica_load_CG signal indicates that a current-starved condition does not exist, the transistor Q83 is biased to conduct a current (1.5 xA) that is 50 percent larger than, for example, the current supplied by the transistor Q81. Because the biased current capacity of Q83 is larger than the biased current capacity of Q81, the voltage developed between the respective drains of Q81 and Q83 is quantized as a logical zero by the inverter 832. In response, the inverter 832 outputs a logical one, so that the PMOS transistor Q7 is turned off and the current switch 140 does not inject additional current into the common source node 114.

When the Replica_load_CG signal indicates that a current-starved condition exists, the transistor Q83 is biased to not conduct (and/or to conduct a current that is of a small magnitude that causes the inverter 832 to toggle, for example). When the transistor Q83 is biased to not conduct, the voltage developed between the respective drains of Q81 and Q83 is quantized as a logical one by the inverter 832. In response, the inverter 832 outputs a logical zero, so that the PMOS transistor Q7 is turned on and the current switch 140 is coupled to inject additional current into the common source node 114 (e.g., so the current-starved condition of the common source node 114 is alleviated).

For example, the Replica_loadz_CG signal can indicate that a current-starved condition exists by a reducing the voltage level of the Replica_load_CG signal, (e.g., so that the NMOS transistor Q83 is arranged to conduct less and/or to be turned off). When the voltage of the Replica load signal is reduced to a voltage level selected to indicate that a current-starved condition exists, the Aux_bias generator 830 is coupled to assert the bias signal to activate the current switch 140 (e.g., in response to a decrease in voltage of the indication received from the Replica_load_CG signal node). Accordingly, the current of the replica load signal can be reduced in response to the voltage drop of the common source node.

Figure 9:
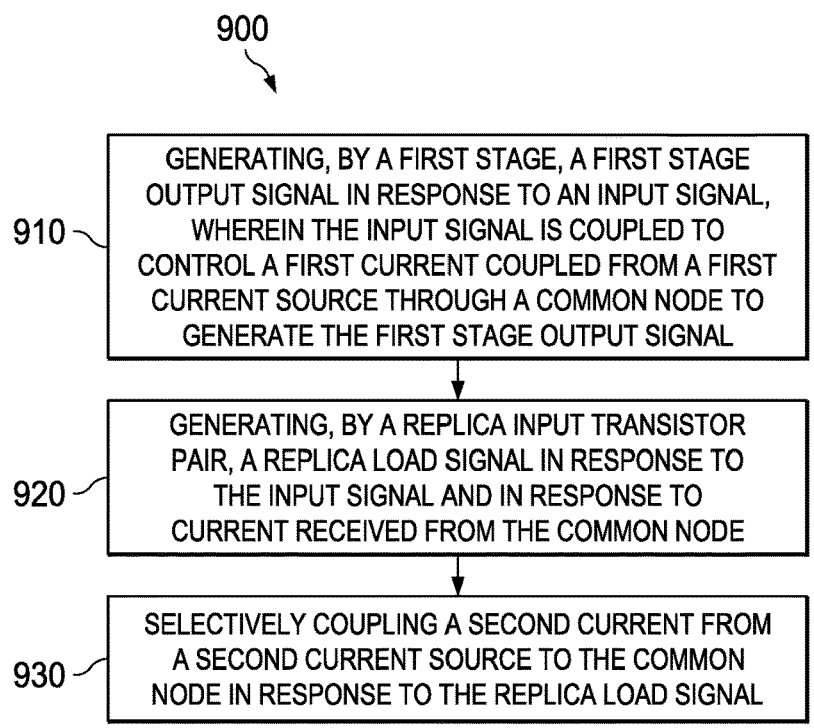
FIG. 9 is a flow diagram of an example method for a response of an example low power comparator to input signal fluctuations.

FIG. 9 is a flow diagram of an example method for a response of an example low power comparator to input signal fluctuations. The process 910 of the example method 900 comprises generating, by a first stage, a first stage output signal in response to an input signal, wherein the input signal is coupled to control a first current coupled from a first current source through a common node to generate the first stage output signal.

The process 920 comprises generating, by a replica input transistor pair, a replica load signal in response to the input signal and in response to current received from the common node. In an example, the replica load signal is generated in response to detecting current-starved response of an input transistor pair arranged to generate the first stage output signal. In another example, the replica load signal is generated in response to an emulation of the input transistor pair.

The process 930 comprises selectively coupling a second current from a second current source to the common node in response to the replica load signal.

Various examples (and example operations thereof) of a comparator having lower power consumption and reduced latencies are described herein with respect to the accompanying figures. A figure of merit of the lower power consumption and reduced latencies can be the multiplicative product of the power consumed and the reduction in latency (e.g., power*delay). In various simulations described hereinabove, a three-times improvement in comparator delay for same power have been observed. The synergy of the increase in robustness with the reduced power and latencies (e.g., described hereinabove with respect to simulation 700) can extend the figure of merit beyond three times in situations in which the input signals are within narrow margins.

Modifications are possible in the described examples, and other examples are possible, within the scope of the claims.

What is claimed is:
1. A circuit comprising:
   a differential input;
   an amplifier stage coupled to a common node and to the differential input;
   a first set of input transistors coupled between the common node, a replica node, and the differential input;
   a bias generator coupled to the replica node and a bias node, and coupled to receive a first bias signal and a second bias signal; and a current switch coupled to the common node and the bias node.

2. The circuit of claim 1, wherein the bias generator includes:
a current source coupled to the bias node;
a first transistor coupled between the bias node and the replica node; and
a second transistor coupled between the replica node and a ground node.

3. The circuit of claim 1,
wherein the differential input includes a first input and a second input;
wherein the amplifier stage includes a second set of input transistors coupled to the common node, the second set of transistors includes a first transistor that includes a gate coupled to the first input and a second transistor that includes a gate coupled to the second input.

4. The circuit of claim 3, wherein:
the amplifier stage further includes a differential output that includes a first output and a second output;
the first transistor is coupled between the common node and the first output; and
the second transistor is coupled between the common node and the second output.

5. The circuit of claim 4, wherein the amplifier stage further includes:
a first resistor coupled between the first output and a divided voltage node; and
a second resistor coupled between the second output and the divided voltage node.

6. The circuit of claim 5, wherein the amplifier stage further includes:
a first transistor coupled between the first output and a ground node; and
a second transistor coupled between the second output and the ground node.

7. The circuit of claim 6, wherein:
the first transistor includes a gate coupled to the divided voltage node; and
the second transistor includes a gate coupled to the divided voltage node.

8. The circuit of claim 4, wherein:
the amplifier stage is a first amplifier stage; and
the circuit further comprises a second amplifier stage coupled to the differential output of the first amplifier stage.

9. The circuit of claim 8, wherein the second amplifier stage further includes:
a third transistor that includes a gate coupled to the first output of the first amplifier stage; and
a fourth transistor that includes a gate coupled to the second output of the first amplifier stage.

10. The circuit of claim 3,
wherein the differential input includes a first input and a second input; and
wherein the second set of input transistors comprises a first transistor that includes a gate coupled to the first input, and a second transistor that includes a gate coupled to the second input.

11. The circuit of claim 1, further comprising a current source coupled to the common node.

12. A circuit comprising:
a replica input transistor pair coupled to a common node, the replica input transistor pair configured to:
detect a voltage drop on the common node; and
provide a replica signal based on the voltage drop on the common node;
a bias generator coupled to the replica input transistor pair and configured to receive a first bias control signal and a second bias control signal and provide a bias signal based on the replica signal; and
a current switch coupled to the bias generator via a bias node and to the common node and configured to provide current to the common node based on the bias signal.

13. The circuit of claim 12, further comprising:
a differential input including a first input and second input; and
a first set of input transistors including:
a first transistor that includes a gate coupled to the first input; and
a second transistor that includes a gate coupled to the second input.

14. The circuit of claim 13, wherein each of the first and second transistors is coupled to the common node.

15. The circuit of claim 14, further comprising an amplifier stage comprising:
a first resistor coupled between the first transistor and a divided voltage node; and
a second resistor coupled between the second transistor and the divided voltage node.

16. The circuit of claim 13, wherein the replica input transistor pair includes:
a first transistor that includes a gate coupled to the first input; and
a second transistor that includes a gate coupled to the second input.

17. The circuit of claim 16, wherein the first and second transistors are coupled between the common node and a replica node to provide the replica signal at the replica node.

18. The circuit of claim 12, further comprising a current source coupled to the common node.

19. A method comprising:
detecting, by a replica input transistor pair, a voltage drop on a common node, the replica input transistor pair coupled to the common node and a differential input;
providing, by the replica input transistor pair, a replica signal based on the voltage drop on the common node;
providing, by a bias generator, a bias signal to a bias node based on the replica signal, the bias generator coupled to the replica input transistor pair and coupled to receive a first bias control signal and a second bias control signal; and
providing, by a current switch, current to the common node based on the bias signal, the current switch coupled to the bias generator via the bias node and to the common node.

20. The method of claim 19, further comprising:
receiving, by the bias generator, the replica signal; and
receiving, by the current switch, the bias signal.

* * * * *